(12) United States Patent
Abbott et al.

(10) Patent No.: US 7,213,314 B2
(45) Date of Patent: May 8, 2007

(54) METHOD OF FORMING A SURFACE ACOUSTIC WAVE (SAW) FILTER DEVICE

(75) Inventors: Benjamin P. Abbott, Longwood, FL (US); Svetlana Malocha, Winter Springs, FL (US); Jack Chocola, Lake Mary, FL (US); Gary Monetti, Apopka, FL (US); Joshua M. Zepess, Bend, OR (US)

(73) Assignee: Triquint, Inc., Orlando, FL (US)

( * ) Notice: Subject to any disclaimer, the term of this patent is extended or adjusted under 35 U.S.C. 154(b) by 0 days.

(21) Appl. No.: 11/428,924

(22) Filed: Jul. 6, 2006

(65) Prior Publication Data

US 2007/0028433 A1 Feb. 8, 2007

Related U.S. Application Data

(62) Division of application No. 10/454,797, filed on Jun. 4, 2003, now Pat. No. 7,105,980.

(60) Provisional application No. 60/393,527, filed on Jul. 3, 2002.

(51) Int. Cl.
*H04R 17/00* (2006.01)
*H01L 41/00* (2006.01)
*H03H 9/00* (2006.01)

(52) U.S. Cl. .................. 29/25.35; 29/594; 29/846; 29/847; 310/313 A; 333/193

(58) Field of Classification Search ............ 29/25.35, 29/592.1, 594, 846, 847; 310/313 A, 313 B, 310/313 D, 313; 333/193, 187, 195; 451/57, 451/58
See application file for complete search history.

(56) References Cited

U.S. PATENT DOCUMENTS 4,037,176 A * 7/1977 Ono et al. ............... 333/155

5,215,546 A * 6/1993 Cho et al. ............... 29/25.01
5,446,330 A   8/1995 Eda et al.
5,448,126 A   9/1995 Eda et al.

(Continued)

OTHER PUBLICATIONS

Kazuhiko, Yamanouchi; SAW Properties of SiO2/128° Y-X LiNbO3 Structure Fabricated by Magnetron Sputtering Technique;IEEE Transactions on Sonics and Ultrasonics, vol. SU-31, No. 1, Jan. 1984; pp. 51-57.

(Continued)

*Primary Examiner*—A. Dexter Tugbang
*Assistant Examiner*—Tai Van Nguyen
(74) *Attorney, Agent, or Firm*—Allen, Dyer, Doppelt, Milbrath & Gilchrist, P.A.

(57) ABSTRACT

A SAW filter includes a piezoelectric substrate of Lithium Niobate or optionally Lithium Tantalate having a thickness of at least twice an acoustic wavelength. The piezoelectric substrate is bonded to a surrogate substrate of a silicon material. The surrogate substrate is characterized by a resistivity of at least 100 ohm-cm and an expansion coefficient compatible with the piezoelectric substrate. A catalytic bonding film between the piezoelectric substrate and the surrogate substrate is formed from a first catalytic bonding film deposited onto a surface of the piezoelectric substrate and a second catalytic bonding film deposited onto a surface of the surrogate substrate. The piezoelectric substrate is bonded to the surrogate substrate through a compression force sufficient for providing a bonding at a normal temperature.

5 Claims, 5 Drawing Sheets

U.S. PATENT DOCUMENTS

| | | | | |
|---|---|---|---|---|
| 5,469,170 | A | * | 11/1995 | Mariani ........................ 342/51 |
| 5,896,636 | A | * | 4/1999 | Penunuri .................... 29/25.35 |
| 5,998,907 | A | * | 12/1999 | Taguchi et al. ......... 310/313 R |
| 6,424,238 | B1 | | 7/2002 | Penunuri |
| 6,570,470 | B2 | | 5/2003 | Maehara et al. |

OTHER PUBLICATIONS

Kiyoshi, Nakamura; Effect of a Ferroelectric Inversion Layer on the Temperature Characteristics of SH-Type Surface Acoustic Waves on 36° Y-X LiTa03 Substrates;IEEE Transactions on Ultrasonics, Ferroelectrics and Frequency Control, vol. 41, No. 6, Nov. 1994; pp. 872-875.

T.E. Parker; Stability of SAW Controlled Oscillators; 1975 Ultrasonics Symposium Proceedings, IEEE Cat. No. 75 CHO 994-4SU; pp. 261-263.

* cited by examiner

METHOD OF FORMING A SURFACE ACOUSTIC WAVE (SAW) FILTER DEVICE

CROSS-REFERENCE TO RELATED APPLICATIONS

This application is a Divisional application of U.S. application Ser. No. 10/454,797, filed Jun. 4, 2003 now U.S. Pat. No. 7,105,980 which claims the benefit of U.S. Provisional Application No. 60/393,527, filed Jul. 3, 2002, the disclosures of which are herein incorporated by reference in their entirety.

FIELD OF THE INVENTION

The present invention relates to surface acoustic wave devices useful for applications in wireless communications.

BACKGROUND OF THE INVENTION

Surface acoustic wave devices are commonly used in wireless communications for meeting system-filtering requirements. Generally, surface acoustic wave (SAW) filters are manufactured by forming interdigital transducers on piezoelectric substrates such as Lithium Niobate, Lithium Tantalate, Quartz, or the like. Lithium Niobate and Lithium Tantalate have strong electromechanical coupling but generally suffer from high temperature drift, whereas Quartz has stable temperature characteristics but poor electromechanical coupling. For example, a 64° Y-cut, X-propagation Lithium Niobate typically exhibits 70–75 ppm/° C. of temperature drift and has a strong coupling of approximately 11%, while a 46° Y-cut in Lithium Tantalate has a temperature coefficient in the range of 40–60 ppm/° C. and coupling of about 9%. Quartz basically exhibits a zero linear temperature coefficient, but it has a very weak coupling coefficient of 0.15%. For RF SAW filters in wireless phone applications, by way of example, a strong coupling is a desirable substrate characteristic that results in a lower insertion loss and facilitates a filter design having a wider fractional bandwidth. As a result, Lithium Tantalate and Lithium Niobate are generally used in the manufacture of RF SAW filters. However, the relatively high temperature drift associated with these substrates typically precludes their use in SAW devices for certain applications that require a very high close-in rejection. As a result, SAW designers are constantly searching for ways to provide a SAW device on a substrate that can provide both strong electromechanical coupling and good temperature characteristics. A substrate with a combination of strong coupling and temperature stability will allow SAW designers to enhance the flexibility of their SAW device designs and extend SAW filter applications for the wireless phone handset, personal communications service, and PCS duplexer, by way of example, which have a very high close-in rejection requirements. Typically, PCS duplexers have been implemented using ceramic filter technology. While SAW filters are significantly smaller than comparable ceramic filters, the temperature drift of SAW devices on high coupling substrates such as Lithium Tantalate and Lithium Niobate make them undesirable for PCS duplexer application. Duplexers are dual band filters, typically connected directly after the antenna, providing the communications system with simultaneous filtering within the receive path and the transmit signal path. By being so very close to the antenna, key requirements for a PCS SAW duplexer are its power handling capability and low insertion loss along with steep skirt selectivity. Additionally, while Lithium Tantalate has a lower temperature coefficient as compared to Lithium Niobate, it is more pyro-sensitive. The pyroelectric effect is a phenomenon in which an electric field is built up due to a thermal change across the crystalline substrate. If not properly controlled, the pyroelectric effect may cause damage to the SAW device during the manufacturing process, thus reducing yield and reliability of the device.

In view of the aforementioned, numerous techniques have been proposed to improve the temperature characteristics of SAW filters fabricated on high coupling Lithium Niobate and Lithium Tantalate. By way of example, K. Yamanouchi et al. "SAW Properties of $SiO_2/128°$ Y-X $LiNbO_3$ Structure Fabricated by Magnetron Sputtering Technique", IEEE Transactions on Sonics and Ultrasonics, vol. SU-31, No. 1, January 1984) have reported on the deposition of silicon dioxide film on top of the piezoelectric substrate of a 128° LiNbO and 36° $YXLiTaO_3$ to improve the temperature characteristics of the SAW device. Yamanouchi showed that a $SiO_2$ film thickness of 0.25 times the wavelength on a 128° $LiNbO_3$ substrate could reduce its temperature coefficient to approximately zero. Parker et al. ("Stability of SAW Controlled Oscillators", IEEE 1975 Ultrasonics Symposium Proceedings) demonstrated that the temperature coefficient of the SAW device on YZ $LiTaO_3$ can be reduced to about zero when a layer of silicon dioxide with film thickness of approximately half that of the SAW wavelength is deposited on the substrate. However, these methods suffer from a major drawback in which the SAW properties depend upon the thickness of the $SiO_2$ film. So while it is possible to demonstrate extremely good temperature performance, the SAW device is highly dispersive and thus prohibits the use of these techniques in production. Nakamura ("Effect of a Ferroelectric Inversion Layer on the Temperature Characteristics of SH-Type Surface Acoustic Waves on 36° Y-X $LiTaO_3$ Substrates) discloses the formation of a polarized inversion layer on the surface of the 36° YX $LiTaO_3$ to effectively change the elastic stiffness constants of the substrate thereby improving its temperature coefficient of delay. Taguchi et al. (U.S. Pat. No. 5,998,907) discloses a number of SAW composite structures combining the large thermal expansion of Lithium Tantalate and Lithium Niobate with that of a low thermal expansion substrate such as glass or silicon to achieve improved temperature characteristics of the composite device. In one embodiment, a 36° $LiTaO_3$ substrate is bonded directly to a low expansion coefficient glass substrate. In yet another embodiment, a composite structure that comprises a thin film insulation layer of silicon dioxide of 1000-Angstrom is deposited on surrogate substrate of Si 36° $LiTaO_3$ is then bonded to the substrate. This structure as disclosed by Taguchi has a major drawback in the performance of the filter passband characteristics. Since the thickness of the silicon dioxide is so very thin, there exists a direct capacitance coupling between the electrode pattern on the surface of the piezoelectric substrate with that of the Si layer, thus degrading the performance of the filter significantly. Thus, while the structure may provide better temperature characteristics, it suffers with a significant degradation in filter passband performance. This would result in higher insertion loss and a narrowing of the passband that renders them unsuitable for mobile applications.

SUMMARY OF THE INVENTION

The present invention may be described by way of example with an embodiment including a SAW filter which includes an electrode pattern deposited on a piezoelectric substrate having a strong electromechanical coupling characteristic, which substrate is bonded at near room temperature to a surrogate substrate through an intermediate catalytic layer to provide desirable temperature compensation for the SAW filter. A very low built in stress level is exhibited at the bonding area, thereby reducing wafer breakage during the fabrication process and improving reliability of the SAW device. The piezoelectric substrate may be Lithium Tantalate or alternatively Lithium Niobate, used with a surrogate substrate of an inorganic Silicon (Si) material. The intermediate layer is comprised of a silicon oxide material. The pre-selected thickness of the silicon oxide material layer provides isolation to a capacitance coupling between the electrode pattern and the Silicon substrate, which in use may be attached to a base. Since Si has a very good thermal conductivity, it improves thermal diffusion through the substrate thereby increasing the power handling capability and reducing the pyro-sensitivity of the SAW device. Yet another embodiment of the invention provides a SAW filter comprising an electrode pattern on a piezoelectric substrate that is bonded to a surrogate substrate through an intermediate bonding layer wherein the thickness of the piezoelectric substrate, the thickness of the bonding layer, the bulk resistivity of the surrogate substrate, and the stress level of the bond area may be changed to adjust the temperature coefficient and passband characteristics of the SAW filter.

One embodiment of the present invention may be described for a surface acoustic wave (SAW) device comprising a piezoelectric substrate having a thickness at least twice an acoustic wavelength of a SAW, a surrogate substrate characterized by an expansion coefficient less than that of the piezoelectric substrate, and a thermal conductivity for facilitating thermal diffusion, and a catalytic bonding film securing the piezoelectric substrate to the surrogate substrate. The catalytic bonding film having a thickness of at least one micron provides isolation between the two substrates to effectively reduce the electrode pattern capacitance coupling. The device will have an expansion coefficient less than that of the piezoelectric substrate.

Another embodiment for a surface acoustic wave (SAW) device comprises a piezoelectric substrate having a thickness at least twice an acoustic wavelength of a SAW operable with the filter device, a surrogate substrate characterized by a resistivity of at least 30 ohm-cm, and a thermal conductivity for facilitating thermal diffusion, and a silicon oxide bonding film securing the piezoelectric substrate to the surrogate substrate.

A method aspect of the invention may include forming a surface acoustic wave (SAW) filter device. One method comprises providing a piezoelectric substrate having a thickness at least twice an acoustic wavelength of a SAW, polishing a surface of the piezoelectric substrate, depositing a silicon oxide film onto the surface of the piezoelectric substrate, and polishing an exposed film surface of the silicon oxide film deposited on the piezoelectric substrate. A surrogate substrate is provided that is characterized by an expansion coefficient less than that of the piezoelectric substrate and a thermal conductivity for facilitating thermal diffusion. The method includes polishing one surface of the surrogate substrate, depositing a silicon oxide film onto the one surface of the surrogate substrate, and polishing an exposed surface of the silicon oxide film deposited on the surrogate substrate. While at a normal temperature, the exposed film surfaces of the silicon oxide films are compressed against each other with a force sufficient for bonding the piezoelectric substrate to the surrogate substrate. As desired, transducers are formed on an exposed surface of the piezoelectric substrate.

BRIEF DESCRIPTION OF THE DRAWINGS

Embodiments of the present invention are herein presented by way of example by referring to the following detailed description and drawings in which.

DETAILED DESCRIPTION OF THE PREFERRED EMBODIMENTS

The present invention will now be described more fully with reference to the accompanying drawings in which various embodiments of the invention are shown and described. It is to be understood that the invention may be embodied in many different forms and should not be construed as limited to the illustrated embodiments set forth herein. Rather, these embodiments are provided so that this disclosure will be thorough and complete, and will convey the scope of the invention to those skilled in the art. Like numbers refer to like elements.

Figure 1A:
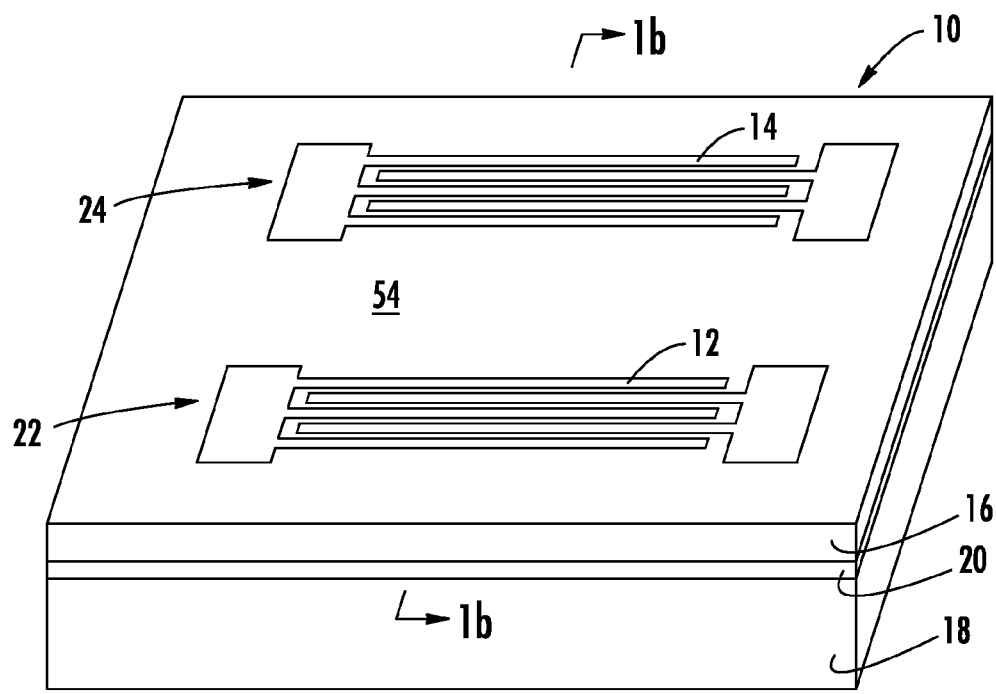
FIG. 1a is a partial top and side perspective view of SAW composite filter embodiment in keeping with the teachings of the present invention.
Figure 1B:
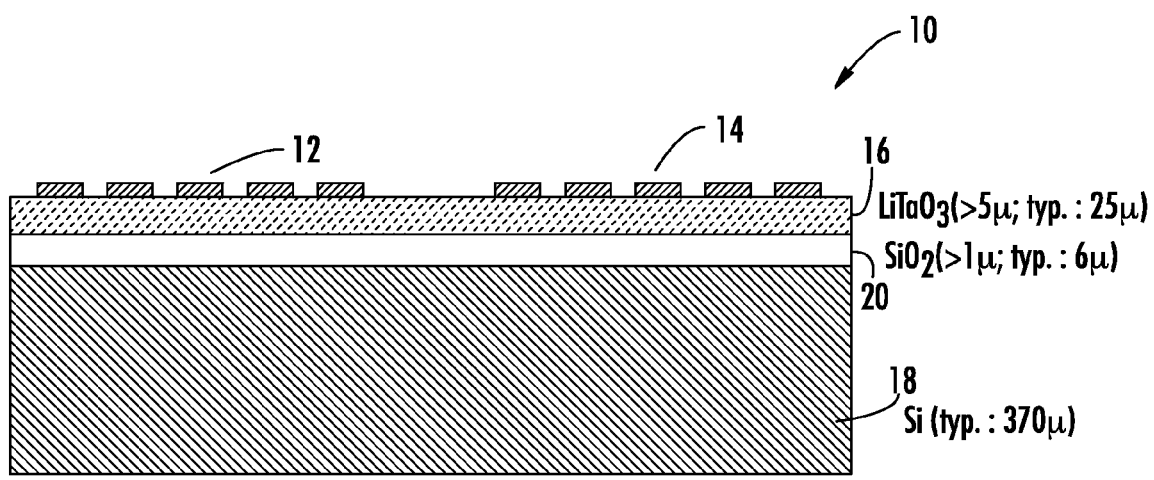
FIG. 1b is a cross-section view of the filter embodiment of FIG. 1 taken through lines 1b—1b.
Figure 1C:
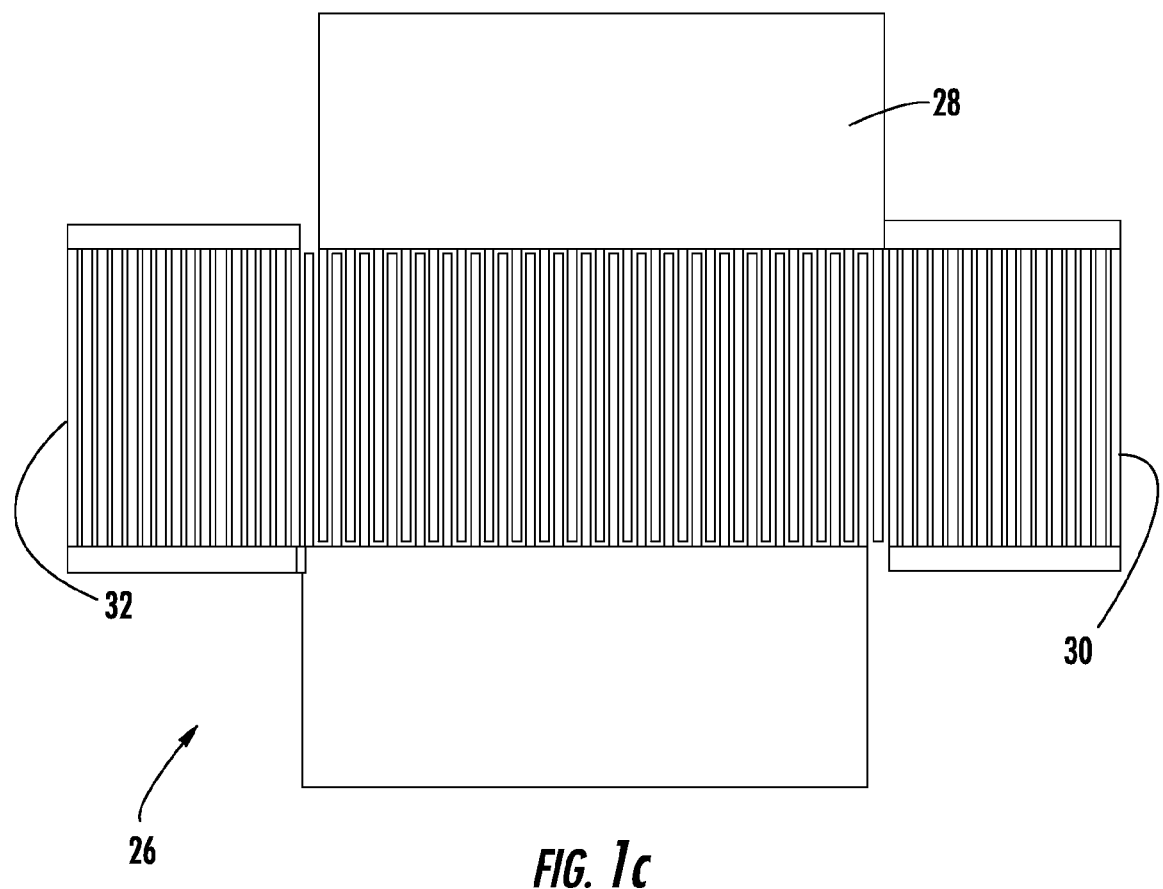
FIG. 1c is a top plan view illustrating one SAW resonator structure including a transducer and reflectors.
Figure 1D:
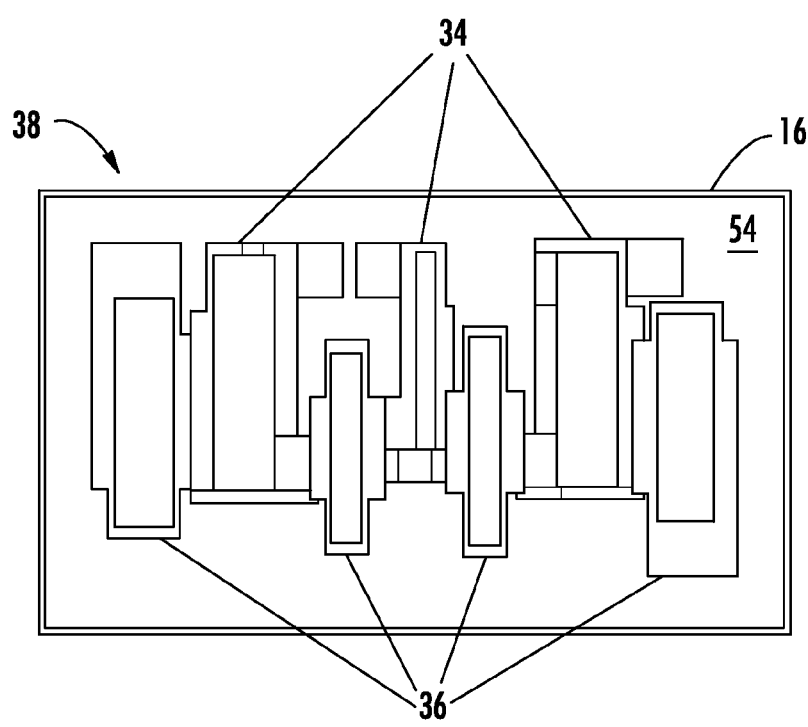
FIG. 1d is a top plan view illustrating one embodiment of a ladder filter including resonator filters within parallel and series arm thereof.
Figure 2:
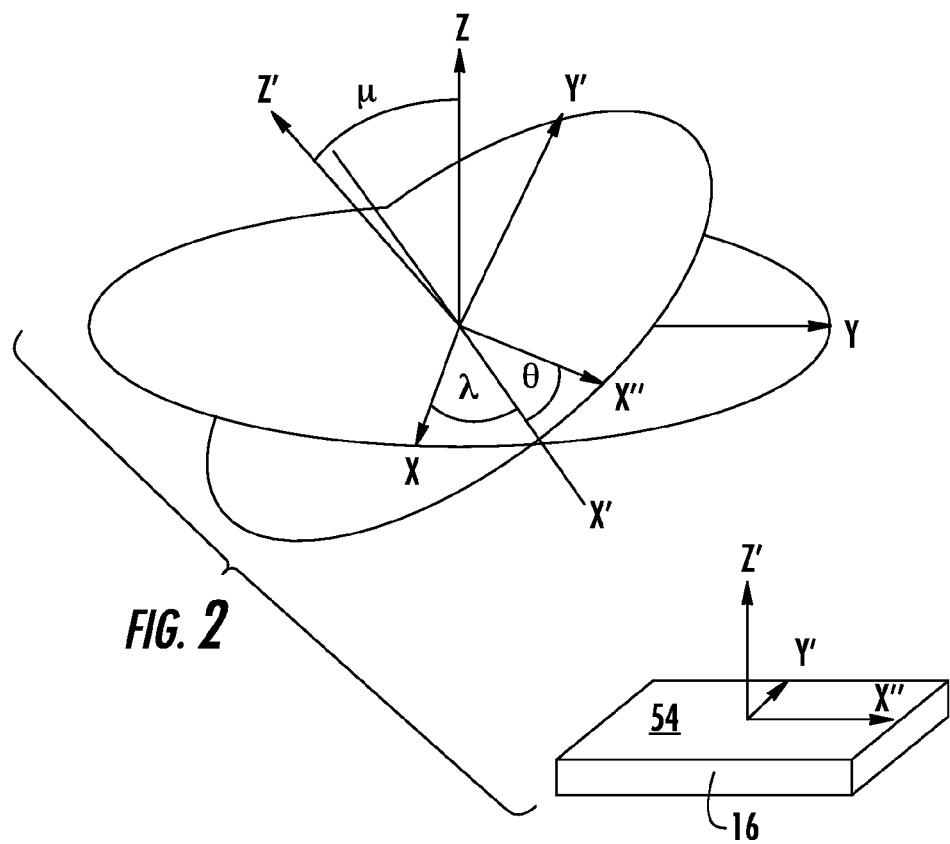
FIG. 2 is a diagrammatical illustration of Euler angles.

One embodiment of the present invention, a SAW filter 10 illustrated with reference to FIG. 1 includes electrode patterns 12, 14 deposited on a piezoelectric substrate 16, which substrate is bonded to a surrogate substrate 18 through a bonding layer 20 of a Silicon oxide material ($SiO_x$). FIG. 1b illustrates a cross section of the composite device of FIG. 1. The electrode patterns 12, 14 form transducers 22, 24 that may be composed of interdigitized electrodes made of aluminum metal, aluminum alloy or a conductive metal. The electrode patterns 12, 14 may also be that of a SAW resonator 26 which may be comprised of a transducer 28 and reflectors 30, 32 as illustrated by way of example with reference to FIG. 1c. The SAW resonator 26 may be arranged in a series arm 34 or a parallel arm 36 of a filter for forming a ladder filter 38 structure as is illustrated, by way of example, with reference to FIG. 1d. The piezoelectric substrate herein described by way of example may be either Lithium Tantalate ($LiTaO_3$) or Lithium Niobate($LiNbO_3$). In one embodiment a 46° Y-cut, X-propagation Lithium Tantalate was used. However, a range of angle cuts varying from 38° to 54° YX of Lithium Tantalate may also be used. This range of angle cuts of 38° to 54° YX of Lithium Tantalate can also be represented by the Euler angles ($\lambda$, $\mu$, $\theta$) where $\lambda$ is set at or about zero degrees, $\mu$ varies from −52° to −36° and θ is set at or about zero degrees. The Euler angle set (λ, μ, θ) is herein defined as illustrated with reference to FIG. 2.

The surrogate substrate used in the experiment is an inorganic substrate of Silicon (Si). Since the temperature coefficient of expansion of Si is 2.6 ppm/° C. while that of 46° YX $LiTaO_3$ is approximately 16 ppm/° C., the combined temperature effect on the SAW device will be generally within the range of 2.6 to 16 ppm/° C., depending upon the thickness of the piezoelectric substrate and the stress level at the bond surface. The effective lowering of the temperature coefficient of expansion of the combined substrate structure results in a reduced temperature coefficient of the SAW device. Thus, it is desirable to make the thickness of the piezoelectric substrate much thinner than that of the surrogate substrate. Assuming a sufficient thickness of the surrogate substrate, the thinner the piezoelectric substrate would imply a better temperature coefficient of the SAW device. However, to maintain certain SAW properties of the piezoelectric substrate, particularly the strong electromechanical coupling, it is preferable that the thickness of the piezoelectric substrate be substantially greater than the acoustic wavelength of the SAW device. By way of example, a minimum of 2.5 wavelength thickness limitation on the thickness of the piezoelectric substrate will ensure that predominantly all SAW energy will be confined within the SAW piezoelectric substrate, thereby minimizing the dispersion of the SAW velocity.

Figure 3:
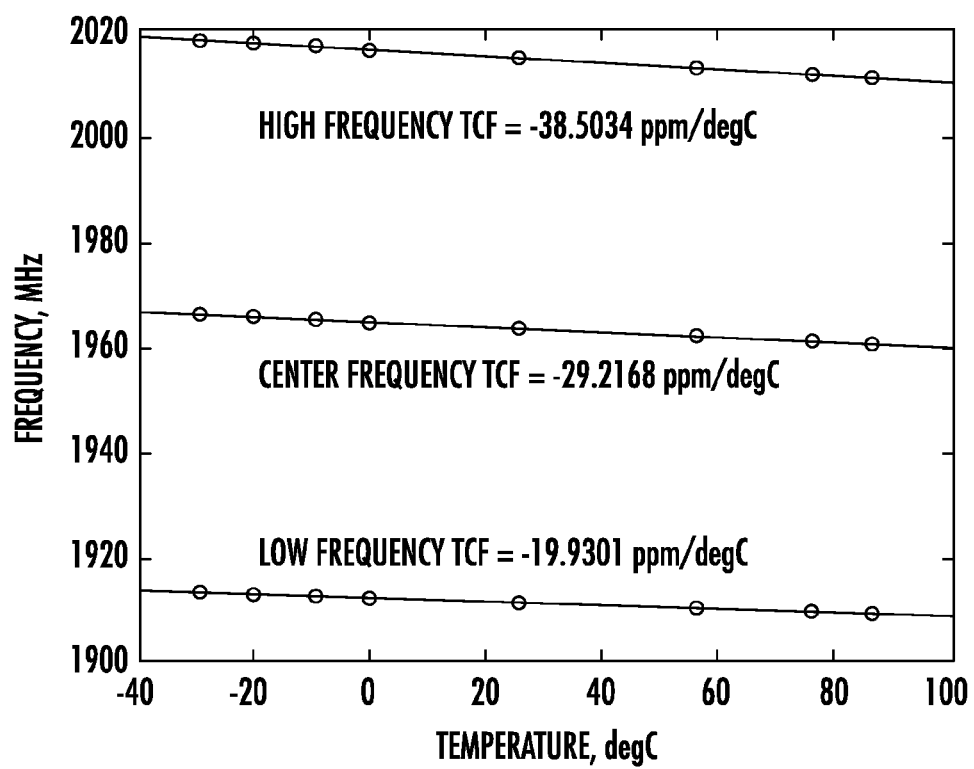
FIG. 3 is a frequency versus temperature plot illustrating frequency drift of a SAW device.
Figure 4:
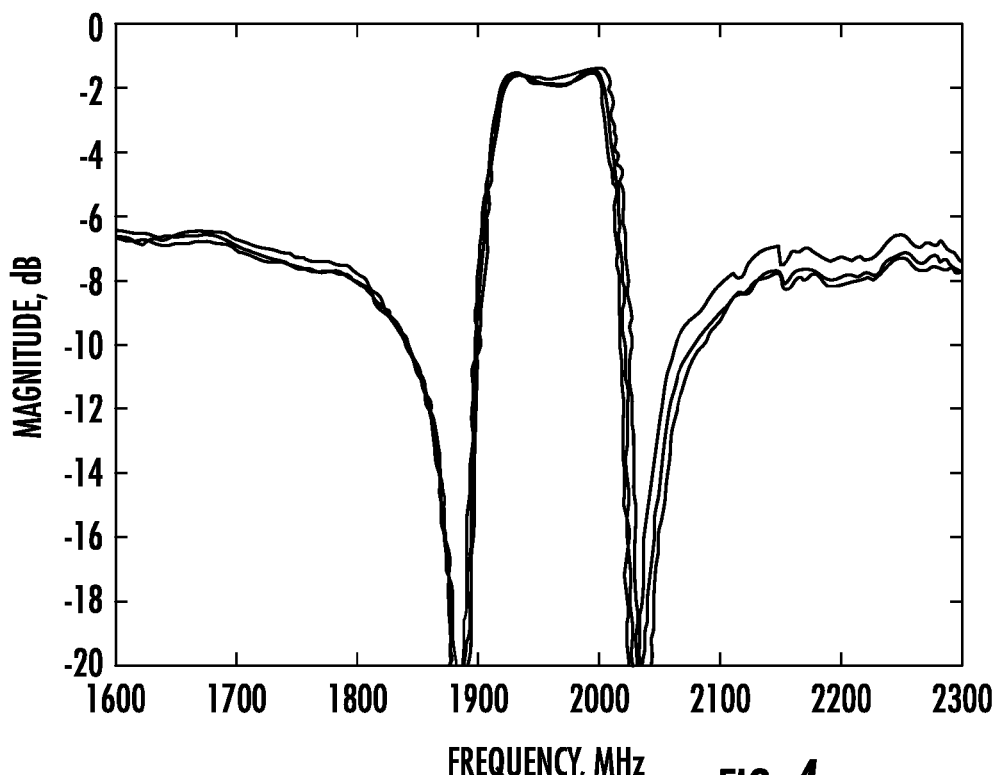
FIG. 4 is a frequency response for a SAW device presented at varying temperatures.

For wireless phone applications, SAW filters that operate in the 1900 MHz frequency band would imply a minimum thickness of 5 microns, by way of example. Typically, the thickness of the piezoelectric substrate is set at about 25 microns to facilitate process handling but may be as high as 100 μ (microns). A catalytic bonding layer of silicon oxide facilitates the bonding of the piezoelectric substrate to the surrogate substrate without the use of excessive applied pressure, voltage or extreme elevated temperature. The thicknesses of the bonding layer of silicon oxide may typically vary from 1–15 μ. Such thicknesses are a factor of at least ten times more than that typically used or suggested in the industry as illustrated with reference to U.S. Pat. No. 5,998,907 to Taguchi. FIG. 3 shows the plot of frequency drift over temperature of a device built according to the embodiment. The temperature coefficient for the low frequency band edge and high frequency band edge is 19.9 ppm/° C. and 38.5 ppm/° C. respectively. Typically, the temperature coefficient for the low frequency band edge and high frequency band edge of an uncompensated SAW device on this cut of $LiTaO_3$ is about 45 ppm/° C. and 55 ppm/° C. respectively. As can be seen with continued reference to FIG. 3, the SAW device on the composite bonded wafer shows significant improvement over the uncompensated device. FIG. 4 illustrates a clean response of the SAW device of the embodiment herein described by way of example taken at three temperature including −30° C., 25° C. and 85° C.

Figure 5:
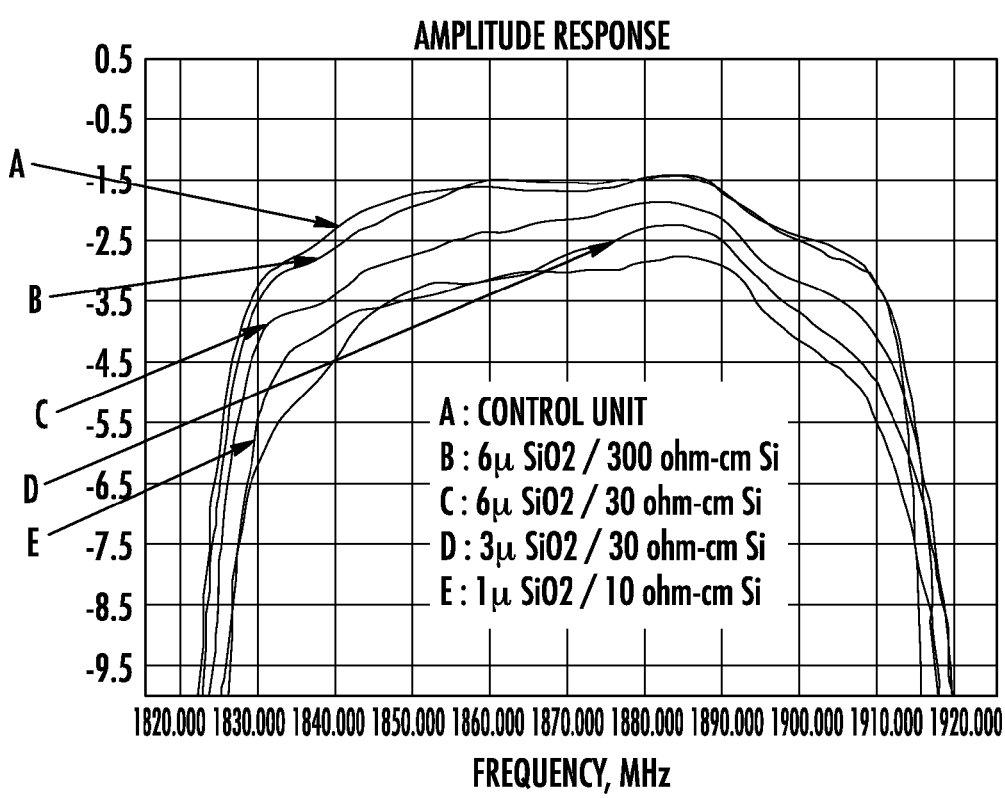
FIG. 5 provides amplitude versus frequency plot illustrating passband characteristics of a SAW filter.

While results of the experiment showed a clear improvement of reduced temperature drift over the uncompensated device, it is useful to compare the passband characteristics of the composite filter with that of an uncompensated filter that will herein be described as a "control unit". A number of experiments were performed in which the thicknesses of the catalytic bonding layer of silicon oxide and the bulk resistivity of the Si substrate were varied. It was discovered that the silicon oxide not only provides a catalytic bonding layer but also provides an isolation layer between the piezoelectric substrate and that of the Silicon surrogate substrate. With reference again to FIG. 1a, there exists a capacitance coupling between the piezoelectric substrate 16 having electrode pattern 12, 14 with the Si layer 20 connected to the base 18. Thus, if the silicon oxide layer is too thin, the capacitance coupling significantly degrades the performance of the filter passband characteristics when compared to that of the control unit. The capacitance coupling is also dependent upon the bulk resistivity of the Si substrate. A greater bulk resistivity will provide greater isolation. The plots of FIG. 5 illustrate passband characteristics of a control filter and of filters with various thicknesses (B–E) of silicon oxide and bulk resistivity of the surrogate layer of Si. As can be seen, the 6 micron thickness of silicon oxide and 300 ohm-cm resistivity provide a close comparison with the passband characteristics of the control unit. Table I illustrates temperature characteristics of the composite device herein described when compared with the control unit. Identified Wafer 2 and Wafer 3 contain devices with the same composite characteristics to demonstrate repeatability of the performance of the composite filters. On the other hand, the one micron thickness of silicon oxide with 10 ohm-cm bulk resistivity of the Si exhibits degradation in insertion loss as well as a significant narrowing of the bandwidth of the filter. This degradation would render the filter less desirable and possibly unsuitable for application. Providing sufficient isolation to the capacitance coupling is desirable for improved filter performance. As can be seen, the composite filter which has a sufficient thickness to the silicon oxide layer and bulk resistivity of Si not only closely match the performance of the unit in passband characteristics but has a temperature drift which is half that of the control unit.

Figure 6:
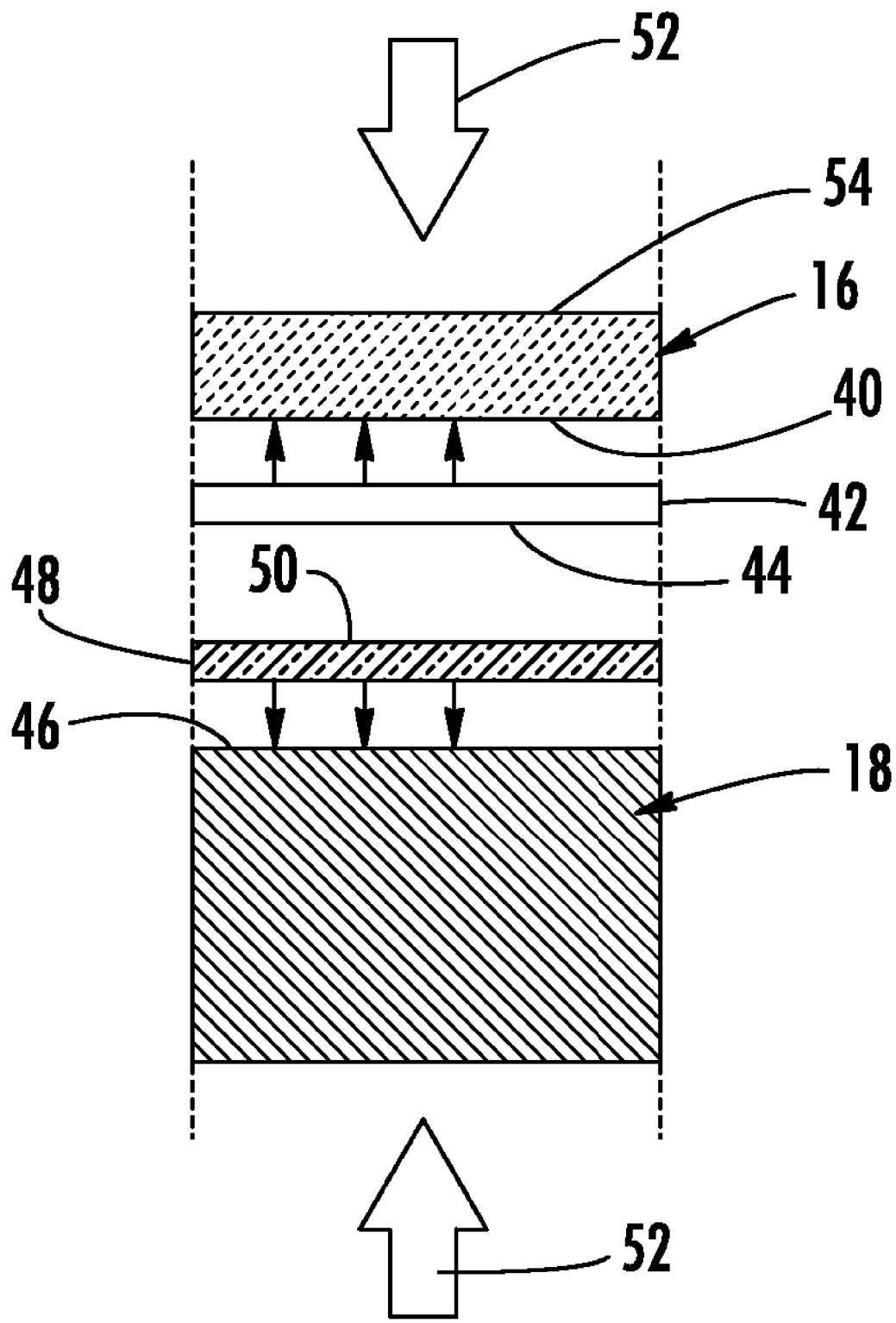
FIG. 6 is a partial exploded cross section view illustrating one process is manufacturing the SAW filter of FIG. 1.

By way of example, consider one method that may include forming the surface acoustic wave (SAW) filter 10 earlier described with reference to FIG. 1a. This method comprises providing the piezoelectric substrate 16 having a thickness at least twice an acoustic wavelength of a SAW, polishing a surface 40 of the piezoelectric substrate and depositing a first silicon oxide film 42 onto the surface 40, as further illustrated with reference to FIG. 6. With continued reference to FIG. 6, an exposed film surface 44 of the silicon oxide film 42 is then polished. The surrogate substrate provided is characterized by an expansion coefficient less than that of the piezoelectric substrate 16 and has a thermal conductivity for facilitating thermal diffusion. The method further includes polishing one surface 46 of the surrogate substrate 18 and then depositing a second silicon oxide film 48 onto the surface 46 of the surrogate substrate. The exposed surface 50 of the second silicon oxide film 48 deposited on the surrogate substrate 18 is polished. While at a normal temperature, the exposed film surfaces 44, 50 of the first and second silicon oxide films 42, 48 are compressed against each other with a force illustrated using arrows 52 sufficient for bonding the piezoelectric substrate 16 to the surrogate substrate 18. As desired, the transducers 22, 24 described earlier with reference to FIG. 1a or transducers and resonators described with reference to FIGS. 1c and 1d as desired, are formed on the resulting exposed surface 54 of the piezoelectric substrate 16.

Bonding of the piezoelectric substrate 16 to the Si substrate 18 may be accomplished in a number of ways, One technique is described in Patent Application Publication No. US 2002/0064906 A1 (dated May 30, 2002) by Paul Enquist, by way of example. This technique allows substrate bonding at normal temperatures and may be herein applied to the SAW composite device above described. Generally the $LiTaO_3$ substrate 16 is available in the range of 250–500μ thickness. Thus, it is first subjected to a lapping process in which a relatively large amount of substrate is removed by mechanical polishing using slurries with relatively large grinding particles. The lapped piezoelectric substrate is prepared to a thickness greater than 2.5 the wavelength of the surface acoustic wave. Typically, a thickness of about 25μ is selected to facilitate other fabrication processes. A film of silicon oxide is deposited on one of the surfaces of the piezoelectric substrate. The deposition of the silicon oxide onto the piezoelectric substrate may include a chemical vapor deposition, a sputtering or an evaporation process. The layer of silicon oxide is then finely polished.

For the preparation of the surrogate substrate, a surrogate substrate of Si of high resistivity (herein greater than 30 ohm-cm) with thickness typically in the range of 100–500 μ is used. Si is a desirable surrogate substrate because of its low expansion coefficient and high thermal conductivity. The top surface of the Si is chemically polished to a desired smoothness and planarity. A catalytic bonding film of silicon oxide is then deposited through thermal oxidation, chemical vapor deposition, sputtering or evaporation on its surface, by way of example. The silicon oxide is then polished to a very fine smooth and planar surface. The surrogate and the piezoelectric substrates are held together such that the silicon oxide layers of each substrate are in extremely close contact with each other. Once in contact, the substrates are held together as a result of a Van der Waal atomic force. The Van der Waal force is a force that exists between molecules of the same substance. A Van der Waal bond is formed, fusing the two substrates. The strength of this bond can be further enhanced by bringing the bonded substrates to an elevated temperature, while still remaining within a normal temperature range well below typical elevated bonding temperatures. By way of example, the range of normal-temperatures within the teachings of the present invention include 15° C. to 125° C. as opposed to the typical bonding temperature range of 300° C. to 400° C. known in the industry. Since the bonding of the substrates is within this normal temperature range, there is very little built in stress at the bonding boundary surfaces. As a result, wafer breakage during otherwise standard fabrication processes of these wafers is dramatically and desirably reduced. Since Lithium Tantalate is a pyro-electric substrate, a near room temperature direct bonding process produces a robust bond to the surrogate substrate. Additionally, the resultant bonded wafer will be more robust and is less likely to fracture or be damaged during the fabrication process. Thus, this technique also improves the reliability of the SAW devices.

Since bonding stress is one of the factors that control the amount of temperature compensation, it is desirable to select a bonding technique such that one can have good control of bonding stress. Once a composite substrate is accomplished, the fabrication of the SAW device may be accomplished through standard processes. While there are numerous techniques for the fabrication of electrodes on SAW devices, chemical etch or lift off processes are two most commonly used techniques. The chemical etch process of SAW device fabrication would involve the deposition of a metal layer, coating of photoresist, exposure and development of photoresist, chemical etching (either wet or dry etch) and cleaning. The lift off process generally requires a deposition and defining of an electrode pattern of the photoresist, exposure and development of the photoresist, with a metal deposition and lift off the unwanted metal layer. Thus, metal electrode pattern forming on a composite substrate is referred to as a composite SAW device.

By way of yet further example, one requirement for a SAW duplexer is its power handling capability. The power handling capability or durability of the SAW device generally depends upon electron-migration in the interdigitated electrodes and the pyro-electric effect of the substrate. Both these phenomena will depend upon the temperature gradient developed across the SAW substrate. In keeping with the teaching of the present invention, the surrogate substrate 18 may be made of an inorganic substrate of Silicon (Si). Si has high thermal conductivity that facilitates thermal diffusion from the SAW substrate to the package, thereby enhancing power-handling capability and reducing the sensitivity of any pyro-electric effect.

The embodiments above described, by way of example, are SAW filters which may comprise an electrode pattern deposited on Lithium Tantalate which is directly bonded to the surrogated substrate such as Silicon, providing temperature compensation as well as enhancing the power handling capability and reducing the sensitivity of the pyro-electricity of the SAW device. As discussed, Lithium Niobate may also be used as the piezoelectric substrate to be bonded with the surrogate substrate to provide a temperature compensated SAW composite device which has enhanced power handling capability and reduced pyro-electricity sensitivity. Pyro-free Lithium Tantalate may be used to further reduce pyro-electric sensitivity.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and alternate embodiments are intended to be included within the scope of the appended claims.

TABLE I

TEMPERATURE DRIFT OF SAW COMPOSITE DEVICE AS COMPARED TO CONTROL UNIT

| PPM/° C. | −30 TO 25 C. | | | 25 TO 80 C. | | |
| --- | --- | --- | --- | --- | --- | --- |
| | CONTROL | WAFER 2 | WAFER 3 | CONTROL | WAFER 2 | WAFER 3 |
| LOWER BAND 4 dB | 31.8 | 11.6 | 13.1 | 26.7 | 7.7 | 11.12 |
| UPPER BAND 4 dB | 51.9 | 23 | 21 | 53.7 | 25.7 | 27.58 |
| LOWER BAND 8 dB | 36.8 | 14.7 | 15.6 | 33.9 | 20 | 13.9 |
| UPPER BAND 8 dB | 48.6 | 25.1 | 24.5 | 48.2 | 13.3 | 27.7 |

TABLE I-continued

TEMPERATURE DRIFT OF SAW COMPOSITE DEVICE AS COMPARED TO CONTROL UNIT

| PPM/° C. | −30 TO 25 C. | | | 25 TO 80 C. | | |
|---|---|---|---|---|---|---|
| | CONTROL | WAFER 2 | WAFER 3 | CONTROL | WAFER 2 | WAFER 3 |
| LOWER BAND 17 dB | 38.8 | 16.5 | 17.5 | 36.2 | 14.4 | 16.3 |
| UPPER BAND 17 dB | 48.1 | 26.6 | 26.1 | 47.1 | 27.3 | 28.5 |

That which is claimed is:

1. A method of forming a surface acoustic wave (SAW) filter device, the method comprising:
    providing a piezoelectric substrate having a thickness at least twice an acoustic wavelength of a SAW;
    polishing a surface of the piezoelectric substrate;
    depositing a silicon oxide film onto the surface of the piezoelectric substrate;
    polishing an exposed film surface of the silicon oxide film deposited on the piezoelectric substrate;
    providing a surrogate substrate characterized by an expansion coefficient less than that of the piezoelectric substrate, and a thermal conductivity for facilitating thermal diffusion;
    polishing one surface of the surrogate substrate;
    depositing a silicon oxide film onto the one surface of the surrogate substrate;
    polishing an exposed surface of the silicon oxide film deposited on the surrogate substrate;
    while at a normal temperature, compressing the exposed film surfaces of the silicon oxide films against each other while providing a force sufficient for bonding the piezoelectric substrate to the surrogate substrate; and
    forming transducers on an exposed surface of the piezoelectric substrate.

2. A method according to claim 1, wherein the piezoelectric substrate comprises one of lithium tantalite and lithium niobate.

3. A method according to claim 1, wherein the surrogate substrate comprises a silicon material having a thickness within a range of 100 to 500 microns.

4. A method according to claim 1, wherein the normal temperature comprises a temperature within a range of 15 degrees centigrade to 125 degrees centigrade.

5. A method according to claim 1, wherein the transducer forming comprises depositing metal electrodes.

* * * * *